United States Patent
McClelland et al.

(10) Patent No.: US 9,530,606 B2
(45) Date of Patent: Dec. 27, 2016

(54) ION SOURCE AND METHOD FOR MAKING SAME

(71) Applicant: NATIONAL INSTITUTE OF STANDARDS AND TECHNOLOGY, Gaithersburg, MD (US)

(72) Inventors: Jabez McClelland, Bethesda, MD (US); Truman Wilson, Gaithersburg, MD (US)

(73) Assignee: THE UNITED STATES OF AMERICA, AS REPRESENTED BY THE SECRETARY OF COMMERCE, Washington, DC (US)

( * ) Notice: Subject to any disclaimer, the term of this patent is extended or adjusted under 35 U.S.C. 154(b) by 177 days.

(21) Appl. No.: 14/666,871

(22) Filed: Mar. 24, 2015

(65) Prior Publication Data

US 2015/0194285 A1    Jul. 9, 2015

Related U.S. Application Data

(60) Provisional application No. 61/973,487, filed on Apr. 1, 2014.

(51) Int. Cl.
*H01J 27/02* (2006.01)
*G21K 1/00* (2006.01)
(Continued)

(52) U.S. Cl.
CPC ............ *H01J 27/022* (2013.01); *H01J 37/04* (2013.01); *H01J 37/08* (2013.01); *H01J 37/22* (2013.01);
(Continued)

(58) Field of Classification Search
CPC .................. H01J 27/022; G21K 1/00
See application file for complete search history.

(56) References Cited

U.S. PATENT DOCUMENTS

| 3,864,575 A | 2/1975 | Hashmi |
| 5,780,862 A | 7/1998 | Sless |
(Continued)

OTHER PUBLICATIONS

J. Javanainen, M. Kaivola, U. Nielsen, 0. Poulsen, and E. Riis, J. Opt. Soc. Am. B-Opt. Phys. 2, 1768 (1985).
(Continued)

*Primary Examiner* — Nicole Ippolito
*Assistant Examiner* — Sean Luck
(74) *Attorney, Agent, or Firm* — Toby D. Hain

(57) ABSTRACT

An articles includes: an ion source configured to provide a first ion beam that has a first brightness; and a cooler configured to receive the first ion beam and to produce a second ion beam from the first ion beam, the second ion beam including a second brightness that is greater than the first brightness. A process for cooling includes receiving a first ion beam that includes a first brightness in a cooler, and the cooler includes a first mirror and a second mirror disposed opposingly to the first mirror; receiving a first laser beam in the cooler; receiving a second laser beam in the cooler; transmitting the first laser beam and the second laser beam through the first ion beam to decrease an emittance of the first ion beam; reflecting the first laser beam from the first mirror and the second laser beam from the second mirror; and transmitting, after being reflected, the first laser beam and the second laser beam through the first ion beam to cool the first ion beam and to decrease the emittance of the first ion beam to produce a second ion beam that includes a second brightness that is greater than the first brightness.

20 Claims, 7 Drawing Sheets

(51) Int. Cl.
*H01J 37/04* (2006.01)
*H01J 37/08* (2006.01)
*H01J 37/22* (2006.01)

(52) U.S. Cl.
CPC ....... *H01J 2237/047* (2013.01); *H01J 2237/26* (2013.01); *H01J 2237/30* (2013.01)

(56) References Cited

U.S. PATENT DOCUMENTS

| 7,709,807 B2 | 5/2010 | McClelland | |
|---|---|---|---|
| 8,530,853 B2 | 9/2013 | Steee | |
| 2003/0136131 A1* | 7/2003 | Chu | F25B 23/003 62/3.1 |

OTHER PUBLICATIONS

L. Desalvo, R. Bonifacio, and W. Barletta, Opt. Commun. 116, 374 (1995).
R. Calabrese, V. Guidi, P. Lenisa, E. Mariotti, and L. Moi, Opt. Commun. 123, 530 (1996).
I. Lauer, U. Eisenbarth, M. Grieser, R. Grimm, r. Lcnisa, V. Luger, T. Schatz, U. Schcamm, D. Schwalm, and M. Weidemuller, Phys. Rev. Lett. 81, 2052 (1998).
B. Sheehy, S.-Q. Shang, P. van der Straten, and H. Metcalf, Chem. Phys. 145, 317 (1990).
M.D. Hoogerland, J.P.J. Driessen, E.J.D. Vredenbregt, H.J.L. Megens, M.P. Schuwer, H.C.W. Beijerinck, and K.A.H. van Leeuwen, Appl. Phys. B Laser Opt. 62, 323 (1996).
R.E. Scholten, R. Gupta, J.J. McClelland, R.J. Celotta, M.S. Levenson, and M.G. Vangel, Phys. Rev. A 55, 1331 (1997).
B.Knuffman, A.V. Steele, J. Orloff, and J.J. McClelland, New J. Phys. 13, (2011).
B. Kauffman, A.V. Steele, and J.J. McClelland, J. Appl. Phys. 114, 044303 (2013).
B.J. Claessens, M.P. Reijnders, G. Taban, O.J. Luiten, and E.J.D. Vredenbregt, Phys. Plasmas 14, 093101 (2007).
11 J.J. McClelland, J.L. Hanssen, M. Jacka, and S.B. Hill, U.S. Pat. No. 7,709,807 B2 (May 4, 2010).
A.V. Steele, B.J. Knuffman, and J.J. McClelland, U.S. Pat. No. 8,530,853 B2 (Sep. 10, 2013).
H. Nujeeb and V.D.H.V.O. Adria, U.S. Pat. No. 3,864,575 A (Feb. 4, 1975).
H.E. Siess, U.S. Pat. No. 5,780,862 A (Jul. 14, 1998).
J. Javanainen et al., "Laser cooling of a fast ion beam," J. Opt. Soc. Am. B-Opt. Phys. 2, 1768 (1985).
L. Desalvo et al., "Transverse laser coiling of two-level particle beams," Optics Communications 116, 374-376 (1995).
R. Calabrese et al., "Transverse laser coiling of ions in a storage ring," Optics Communications 123, 530 (1996).
I. Lauer et al., "Transverse Laser Coiling of a Fast Stored Ion Beam through Dispersive Coupling," Physical Review Letters 81, 2052 (1998).
B. Sheehy et al., "Collimation of a rubidium beam below the Doppler limit," Chemical Physics145, 317 (1990).
M.D. Hoogerland et al., "Bright thermal atomic beams by laser cooling: A 14-fold gain in beam flux," Applied Physics B Lasers and Optics 62, 323 (1996).
R.E. Scholten et al., "Laser collimation of a chromium beam," Physical Review A 55, 1331 (1997).
B. Knuffman et al., "Nanoscale focused ion beam from laser-cooled lithium atoms," New Journal of Physics 13, (2011).
B. Kauffman et al., "Cold atomic beam ion source for focus ion beam applications," Journal of Applied Physics114, 044303 (2013).
B.J. Claessens et al., "Cold electron and ion beams generated for trapped atoms," AIP Physics of Plasma14, 093101 (2007).

* cited by examiner

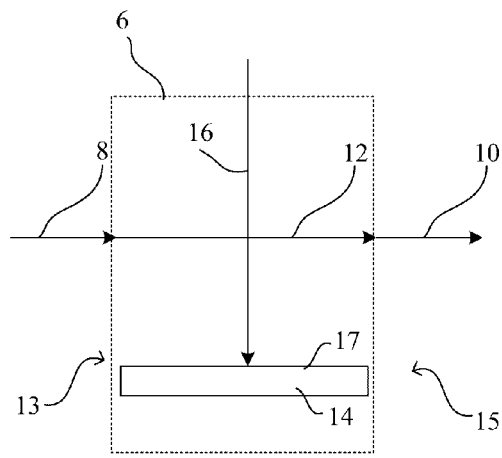
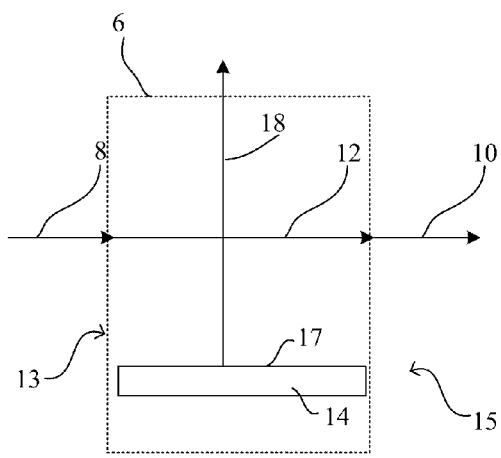
FIG. 3A
FIG. 3B
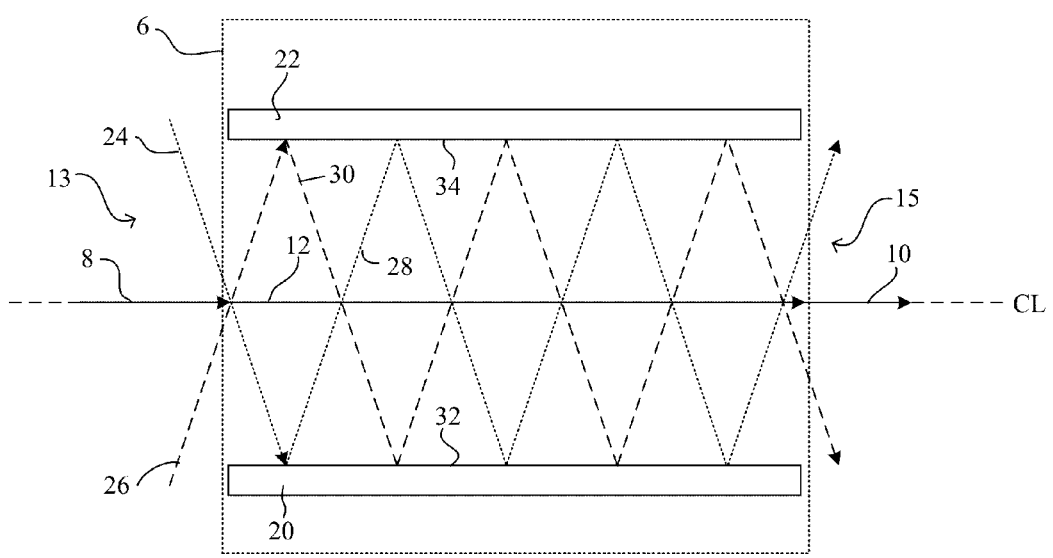
FIG. 4

US 9,530,606 B2

ION SOURCE AND METHOD FOR MAKING SAME

CROSS REFERENCE TO RELATED APPLICATIONS

The present application claims the benefit of U.S. Provisional Patent Application Ser. No. 61/973,487 filed Apr. 1, 2014, the disclosure of which is incorporated herein by reference in its entirety.

STATEMENT REGARDING FEDERALLY SPONSORED RESEARCH

This invention was made with United States government support from the National Institute of Standards and Technology. The government has certain rights in the invention.

BRIEF DESCRIPTION

The above and other deficiencies are overcome by, in an embodiment, an article comprising: an ion source configured to provide a first ion beam comprising a first brightness; a cooler configured to receive the first ion beam and to produce a second ion beam from the first ion beam, the second ion beam comprising a second brightness that is greater than the first brightness.

Further disclosed is a process for cooling, the process comprising: receiving a first ion beam comprising a first brightness in a cooler, the cooler comprising: a first mirror comprising a first reflective surface; and a second mirror comprising a second reflective surface, the second reflective surface being disposed opposingly to the first reflective surface; receiving a first laser beam in the cooler; receiving a second laser beam in the cooler; transmitting the first laser beam and the second laser beam through the first ion beam; reflecting the first laser beam from the first mirror; reflecting the second laser beam from the second mirror; and transmitting, after being reflected, the first laser beam and the second laser beam through the first ion beam to cool the first ion beam and to decrease the emittance of the first ion beam to produce a second ion beam comprising a second brightness that is greater than the first brightness.

BRIEF DESCRIPTION OF THE DRAWINGS

The following descriptions should not be considered limiting in any way. With reference to the accompanying drawings, like elements are numbered alike:

FIGS. 3A and 3B show an embodiment of a cooler;

FIG. 4 shows an embodiment of a cooler;

DETAILED DESCRIPTION

A detailed description of one or more embodiments is presented herein by way of exemplification and not limitation.

It has been discovered that an article provides a high brightness ion beam that is produced by optically cooling a first ion beam to produce as second ion beam having a brightness that is, e.g., greater than $10^7$ amps per square meter per steradian per electron volt (A $m^{-2}$ $sr^{-1}$ $eV^{-1}$). Moreover, the article produces a high-resolution, focused ion beam with beneficial uses such as nanoscale fabrication and analysis tools for nanotechnology.

Figure 1:
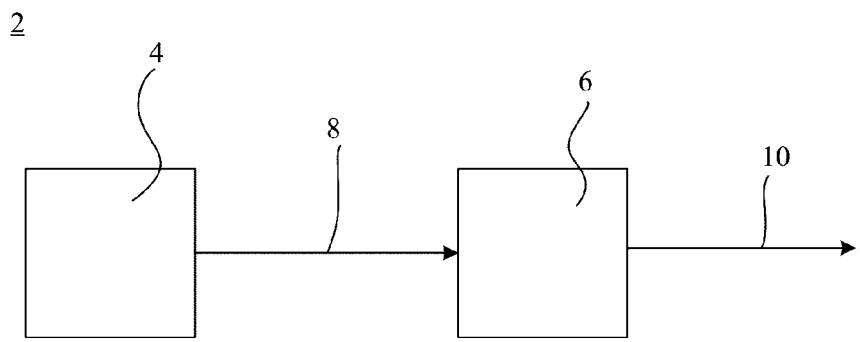
FIG. 1 shows an embodiment of an article.

In an embodiment, as shown in FIG. 1, an article includes ion source 4 in fluid communication with cooler 6. Ion source 4 is configured to provide first ion beam 8 to cooler 6. Cooler 6 is configured to receive first ion beam 8 and to produce second ion beam 10 from first ion beam 8. Here, first ion beam 8 has a first brightness, and second ion beam 10 has a second brightness that is greater than the first brightness.

Ion source 4 can be an ion source that provides a selected beam of ions as first ion beam 8 to cooler 6. Exemplary ion sources 4 include a surface ionization ionizer, an ion extractor, an electron impact ionizer, a field ionizer, a photo ionizer, or combination comprising at least one of the foregoing ion sources. Ion source 4 can be, e.g., an effusive source (e.g., an oven) or supersonic ion beam source. In some embodiments, ion source 4 includes an ion optic such as an electrostatic lens. Such ion optics can control a feature of ions in first ion beam 8. The feature of the ions include position, trajectory, speed, velocity, momentum, spot size, and the like. Ion source 4 can produce first ion beam 8 that is modulated or continuous wave. For modulation of first ion beam 8, a mechanical modulator (e.g., a chopper), electrical modulator (e.g., electrostatic voltage pulsing of an ion optic), optical modulator (e.g., pulsed photoionization beam), or a combination thereof can be used.

Figure 2:
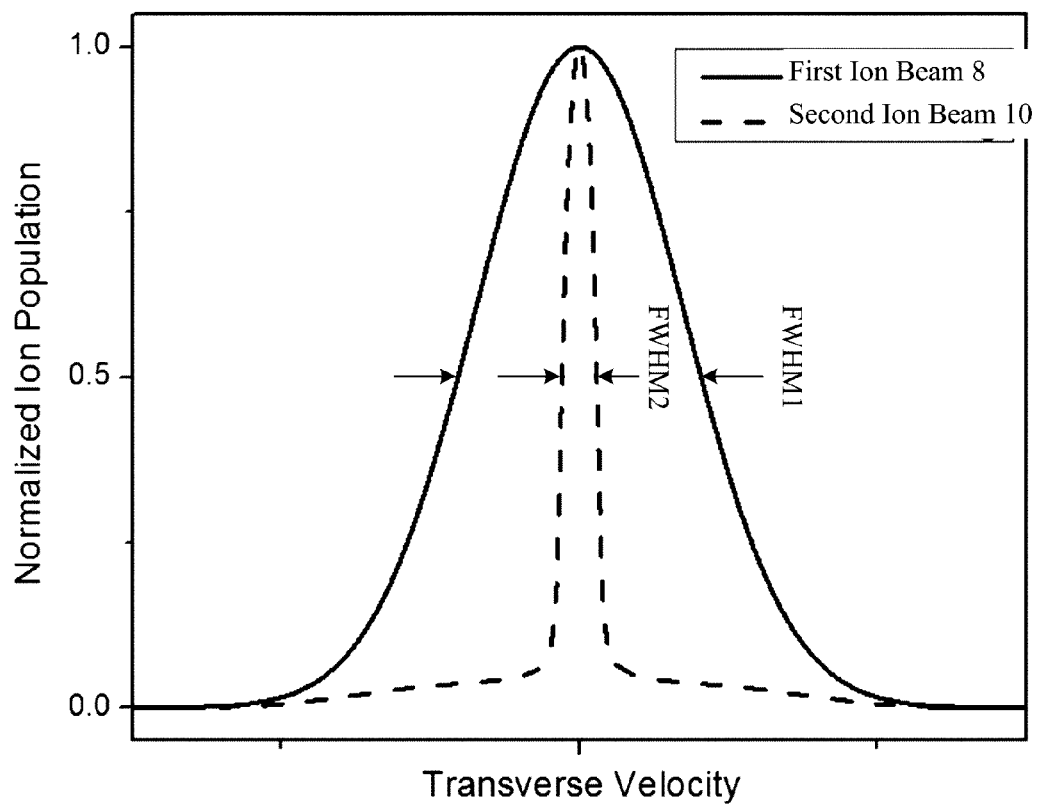
FIG. 2 shows a graph of normalized ion population versus transverse velocity.

Cooler 12 optically cools first ion beam 8 to produce second ion beam 10. As used herein, "cooling" (and variants thereof, e.g., cooled, cools, to cool, and the like) refers to decreasing a spread in a transverse velocity distribution of first ion beam 8 such that second ion beam 10 has a comparatively narrower spread in its transverse velocity distribution as illustrated in FIG. 2, which shows a graph of normalized ion population versus transverse velocity for first ion beam 8 (solid curve) and second ion beam 10 (dashed curve). Here, first ion beam 8 has a first full width at half maximum (FWHM1), and second ion beam 10 has a second full width at half maximum (FWHM2). As shown in FIG. 2, a spread in the transverse velocity distribution of first ion beam 8 is greater than that of second ion beam 10 such that first full width at half maximum (FWHM1) is greater than second full width at half maximum (FWHM2). Without wishing to be bound by theory, it is believed that cooling of first ion beam 8 in cooler 6 is a result of momentum transfer between laser beams and ions in first ion beam 8 as first ion beam 8 traverses cooler 6 as more fully discussed hereafter.

With reference to FIGS. 3A and 3B (which show a longitudinal cross section of cooler 6), according to an embodiment, cooler 6 includes mirror 14. Here, ion source 6 provides first ion beam 8 to cooler 6 at first end 13. Mirror 14 includes reflective surface 17 from which laser beam 16 reflects from as reflected laser beam 18. Laser beam 16 is provided to cooler 6 and propagates through first ion beam 8. As laser beam 16 interacts with first ion beam 8, certain ions included in first ion beam 8 are subjected to momentum-changing collisions with photons in laser beam 16 or reflected laser beam 18 to produce intermediate ion beam 12. Intermediate ion beam 12, which traverses a length of cooler 6, exits cooler 6 at second end 15 as second ion beam 10. In this manner, cooler 6 increases a brightness of the first brightness of first ion beam 8 to the second brightness of second ion beam 10. That is, the second brightness is greater than the first brightness. It should be noted that intermediate ion beam 12 is provided for convenience to refer to a transition of ions in first ion beam 8 to ions in second ion beam 10 as first ion beam 8 is cooled to second ion beam 10.

In an embodiment, with reference to FIG. 4 (which shows a longitudinal cross-section cooler 6), cooler 6 includes first mirror 20 opposingly disposed to second mirror 22. Here, first ion beam 8, intermediate ion beam 12, and second ion beam 10 propagate about centerline CL. Accordingly, these ion beams (8, 12, or 10) independently can have an axis of symmetry about centerline CL or can have an asymmetric shape in a transverse cross-section orthogonal to the view shown in FIG. 4. Exemplary transverse shapes of ion beams (8, 10, 12) include circular, polygonal (e.g., square, rectangular, and the like), annular, and the like. Ion source 4 provides first ion beam 8 to cooler 6 to which first laser beam 24 and second laser beam 26 are provided to interact with first ion beam 8 and intermediate ion beam 12 to produce second ion beam 10. First mirror 20 includes first reflective surface 32 from which first laser beam 24 reflects as reflected first laser beam 28. Second mirror 22 includes second reflective surface 34 from which second laser beam 26 reflects as reflected second laser beam 30.

An angle between a propagation direction of first laser beam 24 and second laser beam 26 is selected to provide counter-acting momentum-changing collisions between first ion beam 8 (and intermediate ion beam 12) with first laser beam 24 and second laser 26. Further, a diameter of first laser beam 24 and diameter of second laser beam 26 independently are selected to overlap completely or partially with first ion beam 8 or second ion beam 12.

In some embodiments, again with reference to FIG. 4, article 2 includes cooler 6 that receives first laser beam 24 and transmits first laser beam 24 through first ion beam 8. Cooler 6 includes first mirror 20 configured to receive first laser beam 24 and to reflect first laser beam 24 through first ion beam 8 or intermediate ion beam 12 to decrease the emittance of first ion beam 8. In some embodiments, first mirror 20 comprises a first planar reflective surface to reflect first laser beam 24. In a certain embodiment, a longitudinal axis of the first planar reflective surface is substantially parallel to centerline CL of first ion beam 8, intermediate ion beam 12, or second ion beam 10. Cooler 6 can further receive second laser beam 26 and transmit second laser beam 26 through first ion beam 8 or intermediate ion beam 12. Additionally, cooler 6 can include second mirror 20 configured to receive second laser beam 26 and reflect second laser 26 beam through first ion beam 8 or intermediate ion beam 12 to decrease the emittance of first ion beam 8.

According to an embodiment, first mirror 20 includes first reflective surface 32 to reflect first laser beam 24, and second mirror 22 includes second reflective surface 34 to reflect second laser beam 26 such that first reflective surface 32 is opposingly disposed to second reflective surface 34. In a particular embodiment, centerline CL of first ion beam 8 or intermediate ion beam 12 is substantially equidistant from first reflective surface 32 and second reflective surface 34.

Figure 5:
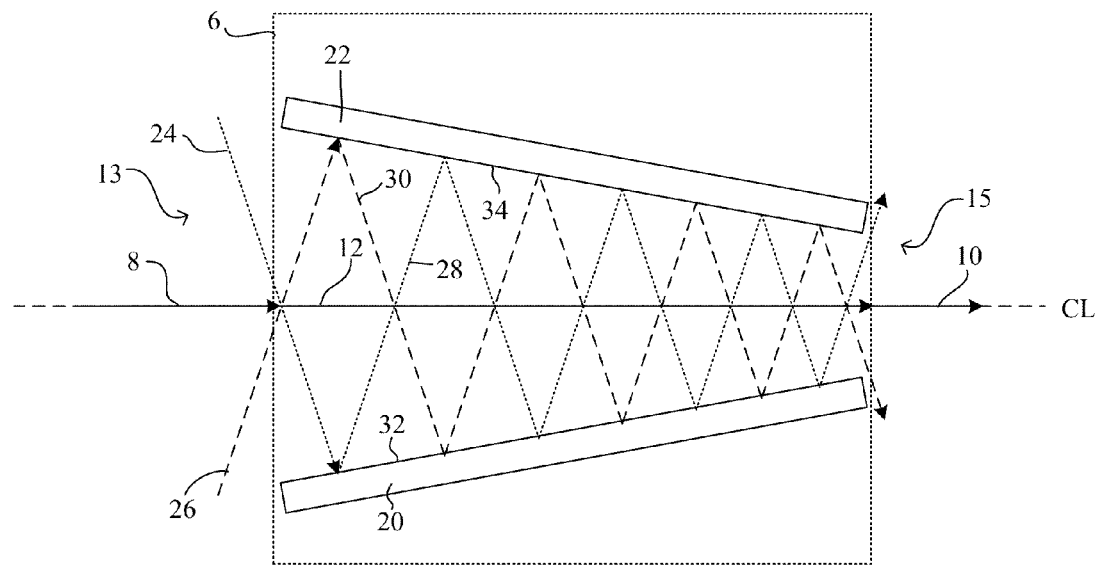
FIG. 5 shows an embodiment of a cooler.

In an embodiment, as shown for a longitudinal cross-section of cooler 6 in FIG. 5, first reflective surface 32 and second reflective surface 34 are tilted at a selected angle with respect to centerline CL. As a result, first reflected laser beam 28 and second reflected laser beam 30 become progressively steeper-angled with respect to centerline CL of first ion beam 8 and intermediate ion beam 12 in a direction from first end 13 to second 15 of cooler 6. Accordingly, a higher efficiency for increasing brightness from the first brightness to the second brightness occurs as compared to an arrangement of first mirror 20 and second mirror 22 being substantially parallel to center CL, e.g., as shown in FIG. 4. Here, first reflective surface 32 and second reflective surface 34 can be substantially planar.

Figure 6:
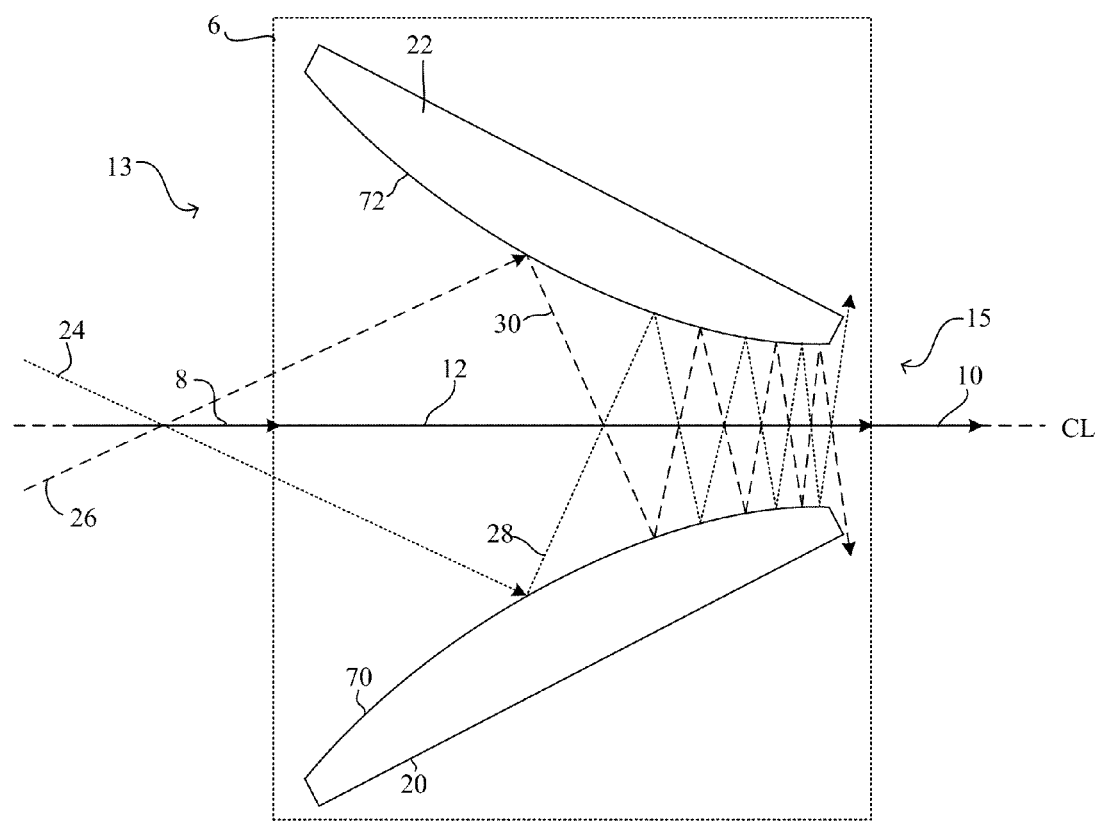
FIG. 6 shows an embodiment of a cooler.

According to an embodiment, as shown for a longitudinal cross-section of cooler 6 in FIG. 6, cooler 6 includes first mirror 20 opposingly disposed to second mirror 22. Here, first mirror 20 includes first convex reflective surface 70, and second mirror 22 includes second convex reflective surface 72 such that a convexity of the surfaces face centerline CL. Moreover, first laser beam 24 reflects from first convex reflective surface 70 to produce first reflected laser beam 28 that produces increasingly steeper angles with respect to centerline CL as first reflected laser beam 28 propagates from first end 13 to second end 15. Similarly, second laser beam 26 reflects from second convex reflective surface 72 to produce second reflected laser beam 30 that produces increasingly steeper angles with respect to centerline CL as second reflected laser beam 30 propagates from first end 13 to second end 15. Accordingly, a higher efficiency for increasing brightness from the first brightness to the second brightness occurs as compared to an arrangement of first mirror 20 and second mirror 22 being substantially parallel to center CL, e.g., as shown in FIG. 4. Here, first reflective surface 32 and second reflective surface 34 can be substantially planar. The degree of convexity of first mirror 20 and second mirror 22 can be selected, and an angle between first mirror 20 and centerline CL as well as second mirror 22 and centerline CL can be selected and coordination with an angle between first and second laser beams (24, 26) with centerline CL. In this manner, a number of reflections of first reflected laser beam 28 and second reflected laser beam 30 can be selected as well as a steepness of the angle of first and second reflected laser beams (28, 32) with respect to centerline CL. It will be appreciated that adjacent reflections of first reflected laser beam 28 and second reflected laser beam 30 from tilted mirrors (20, 22) and convex mirrors (20, 22) respectively shown in FIGS. 5 and 6 increase from first end 13 to second end 15. Additionally, first mirror 20 and second mirror 22, shown in FIGS. 5 and 6, can be symmetric with respect to the plane of the drawing figure, i.e., first mirror 20 and second mirror 22 shown in FIG. 6, extend in and out of plane of the drawing even though first ion beam 8, secondary and being 10, or intermediate ion beam 12 has cylindrical symmetry or some other symmetry.

Figure 7A:
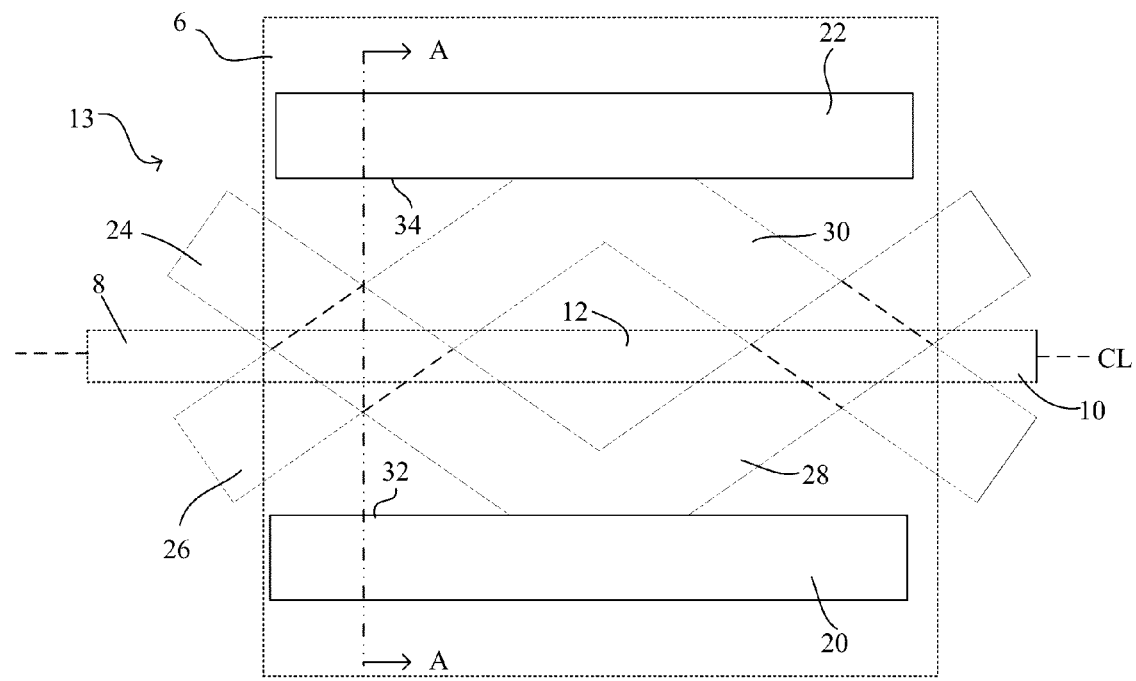
FIGS. 7A and 7B show an embodiment of a cooler.
Figure 7B:
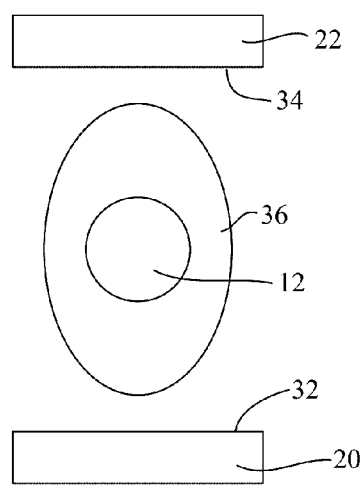

In an embodiment, as shown in a longitudinal cross-section of cooler 6 in FIG. 7A, first mirror 20 poses second mirror 22 such that the first laser beam 24 and second laser beam 26 respectively reflect from first reflective surface 32 and second reflective surface 34. A transverse cross-section along line A-A of FIG. 7A is shown in FIG. 7B. Here, overlap 36 of first laser beam 24 and second laser beam 26 is shown as circumscribing intermediate ion beam 12.

Figure 8A:
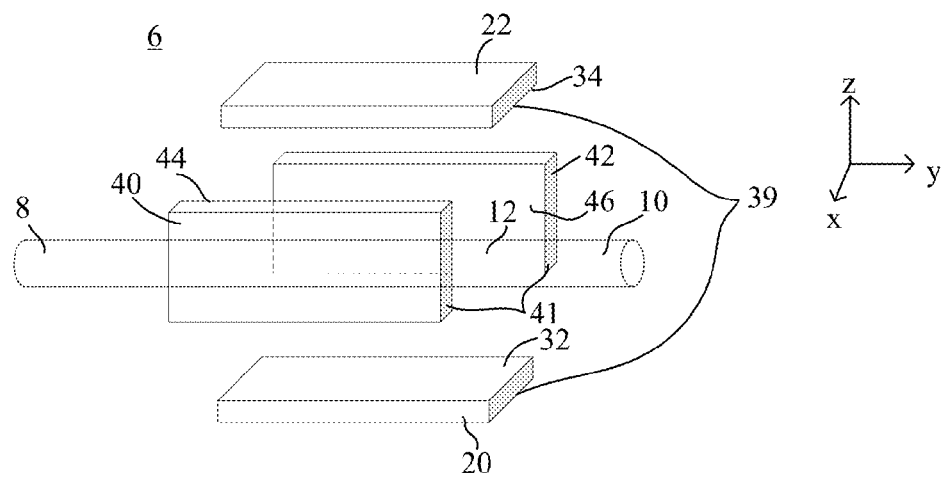
FIGS. 8A, 8B, 8C, 8D, and 8E show an embodiment of a cooler.
Figure 8B:
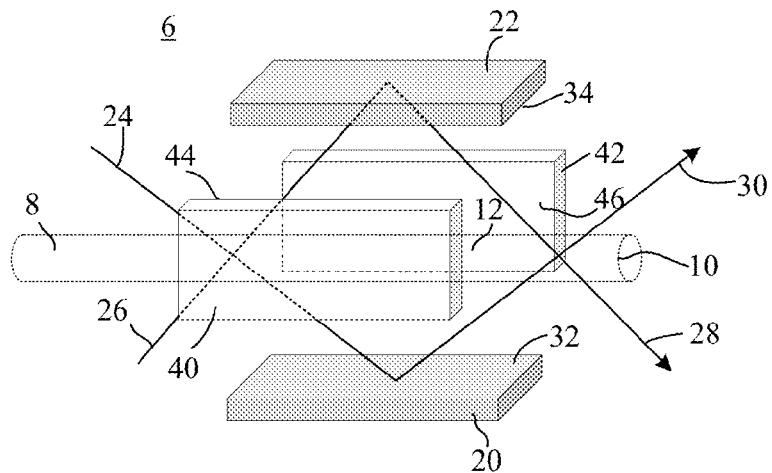
Figure 8C:
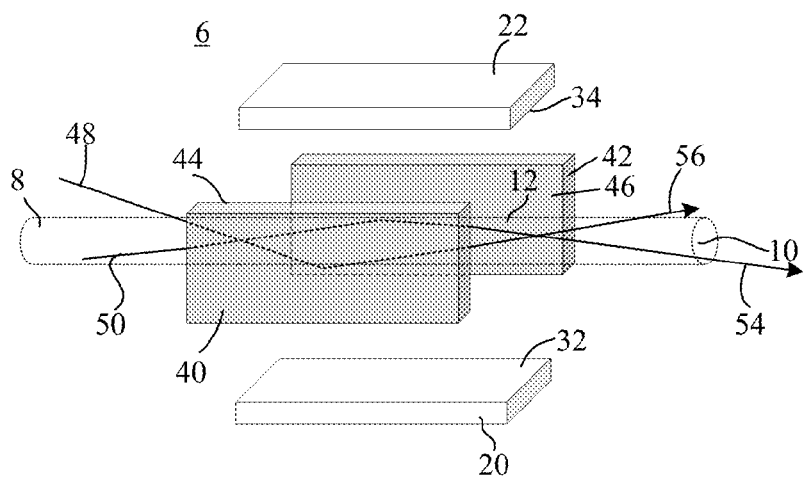
Figure 8D:
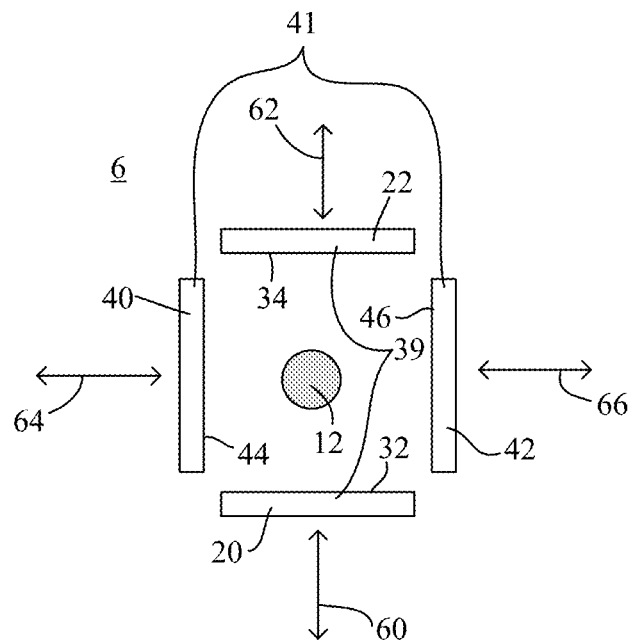
Figure 8E:
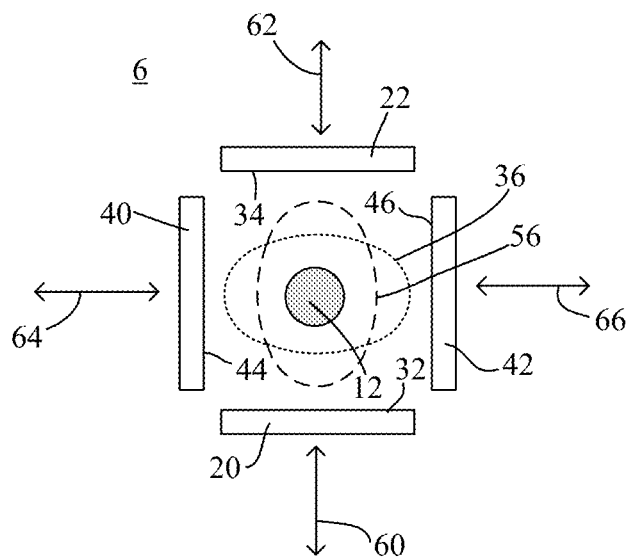

According to an embodiment shown in FIGS. 8A, 8B, and 8C (which are perspective views of cooler 6) and FIGS. 8D and 8E (which are respectively transverse cross-sections along an x-z plane in cooler 6 without and with laser beams present). Here, cooler 6 includes first pair of mirrors 39 and second pair of mirrors 41 disposed orthogonally to first pair of mirrors 39. First pair of mirrors 39 includes first mirror 20 and second mirror 22 opposing one another. The second pair of mirrors 41 includes third mirror 40 and fourth mirror 42. Third mirror 40 includes third reflective surface 44 from which third laser beam 48 reflects to produce reflected third laser beam 52. Similarly, fourth mirror 42 includes fourth reflective surface 46 from which fourth laser beam 50 reflects to produce reflected fourth laser beam 54. In this configuration, first and second laser beams (24, 26) are arranged substantially orthogonal to third and fourth laser beams (48, 50) and respectively have propagation directions 60, 62, 64, and 66 in the x-z plane as shown in FIGS. 8D and 8E. Additionally, in this configuration first and second reflected laser beams (28, 30) are arranged substantially orthogonal to third and fourth reflective laser beams (54, 56) and respectively have propagation directions 60, 62, 64, and 66 in the x-z plane as shown in FIGS. 8D and 8E. Further, with reference to FIG. 8E, overlap 36 of first reflected laser beam 28 and second reflected laser beam 30 is shown as circumscribing intermediate ion beam 12, and second overlap 56 of third reflected laser beam 52 and fourth reflected laser beam 54 is shown as circumscribing intermediate ion beam 12 and FIG. 8E.

In this embodiment, cooler 6 is configured to receive third laser beam 48, transmit third laser beam 48 through first ion beam 8 or intermediate ion beam 12, receive fourth laser beam 42, and transmit fourth laser beam 42 through first ion beam 8. In certain embodiments, third mirror 40 receive third laser beam 48, reflects third laser beam 48 through first ion beam 8 or intermediate ion beam 12, and decrease the emittance of first ion beam 8. Fourth mirror 42 receives fourth laser beam 50, reflects fourth laser beam 50 through first ion beam 8, and decrease the emittance of first ion beam 8.

Third mirror 40 includes third reflective surface 44 to reflect third laser beam 48, and fourth mirror 42 includes fourth reflective surface 46 to reflect fourth laser beam 50 such that third reflective surface 44 is opposingly disposed to fourth reflective surface 46. Here, centerline CL of first ion beam 8 is substantially equidistant from first reflective surface 32, second reflective surface 34, third reflective surface 44, and fourth reflective surface 46.

In some embodiments, first reflective surface 32 and second reflective surface 34 respectively include a planar reflective surface or a curved reflective surface. In a particular embodiment, first reflective surface 32 and second reflective surface 34 each include the curved reflective surface, and the curved reflective surface includes a convex reflective surface facing centerline CL of first ion beam 8.

According to an embodiment, first reflective surface 32, second reflective surface 34, third reflective surface 44, and fourth reflective surface 46 respectively include a planar reflective surface or a curved reflective surface. In a particular embodiment, first reflective surface 32, second reflective surface 34, third reflective surface 44, and fourth reflective surface 46 each include the curved reflective surface, and the curved reflective surface includes a convex reflective surface facing the centerline of the first ion beam. Additionally, first ion beam 8 and second ion beam 10 are collinear.

In an embodiment, article 2 includes cooler 6 that includes, e.g., a Doppler cooler, polarization gradient cooler, Sisyphus cooler or combination thereof. In a certain embodiment, article 2 includes a plurality of coolers 6 disposed in tandem. In a certain embodiment, cooler 6 includes a Doppler cooler to receive first ion beam 8 and to produce intermediate ion beam 12 that includes an intermediate brightness that is greater than the first brightness. Here, cooler 6 also includes a polarization gradient cooler or Sisyphus cooler to receive intermediate ion beam 12 and to produce second ion beam 10 from intermediate ion beam 12, wherein the second brightness is greater than the intermediate brightness.

In an embodiment, first ion beam 8 and second ion beam 10 independently include a plurality of ions such as a monovalent cation of an element from period 4, period 5, period 6, period 7, period 8, or a combination thereof. In some embodiments, the plurality of ions includes cations of higher charge state (e.g., 2+, 3+, etc.) or anions of appropriate energy level structure for laser cooling. In some embodiments, the plurality of ions includes an ion of an element having an atomic mass number greater than or equal to 69, corresponding to the lowest known nuclide of krypton $^{69}$Kr.

First ion beam 8 can have a low kinetic energy, e.g., less than 5000 electron volts (eV) and first brightness that can be include a plurality of ions that has an optical transition at a wavelength of the first laser beam 24. Exemplary source ions include $Ba^+$, $Sr^+$, $Ca^+$, $Mg^+$, $Be^+$, $Cd^+$, $In^+$, $Hg^+$, $Yb^+$, and the like. It is contemplated that the plurality of ions is made in various ways. Exemplary ways to produce the plurality of ions include extraction from a plasma, photoionization, electron beam impact, surface ionization, and the like. In an embodiment, a surface ionization source for forming the source ions, e.g., $Ba^+$, is contemplated. It should be appreciated that the plurality of ions in first ion beam 8 can be identical to one another, or the plurality of ions in first ion beam can be a composition of different ions (e.g., a composition of ions of period 5, ions of period 6, ions of period 7, or a combination thereof). The surface ionization source can include a metal having a high-work function (e.g., Ir) that is heated to a temperature (e.g., greater than 1000° C.) effective to ionize an atom of lower ionization potential, such as Ba atoms. Without wishing to be bound by theory, it is believed that charge transfer occurs between the solid metal and the Ba atoms, forming $Ba^+$. It should be appreciated that surface ionization can efficiently produce many different source ions such as alkali metal ions, alkaline earth metal ions, and the like.

According to an embodiment, ion source 4 can include ion optics that are configured to extract, select, or produce a selected kinetic energy of ions in first ion beam 8. Such selection can be achieved by application of an electric potential to the ion optics. The plurality of ions (e.g., $Ba^+$) from ion source 4 is extracted and formed into a collimated low energy ion beam via, e.g., the ion optics. First ion beam 8 can be transmitted and received by cooler 6 to be subjected to laser illumination (from, e.g., first laser beam 24, second laser beam 26, third laser beam 48, fourth laser beam 50, and their respective reflected laser beams 28, 30, 52, 54) such that optical forces cool first ion beam 8 or intermediate ion beam 12 to reduce its transverse velocity spread (i.e., a width of the velocity distribution), e.g., first full width at half maximum FWHM1. Consequently, decreasing the transverse velocity spread FWHM1 through laser cooling decreases the emittance of first ion beam 8 to produce the second ion beam 10 having the second emittance that is less than the first emittance. Surprisingly, decreasing the emittance of the first ion beam 8 occurs without introducing an aperture between or after ion source 4 and second end 15 of cooler 6. Beneficially, cooling first ion beam 8 by cooler 6 maintains a current in second ion beam 12 from first ion beam 8, i.e., second ion beam 10 and first ion beam 8 have substantially the same current. Thus, in an embodiment, the beam emittance is decreased without reducing the current from first ion beam 8 to second ion beam 10, and brightness is increased from the first brightness to the second brightness.

Mirrors (20, 22, 40, 42) that include reflective surface (32, 34, 44, 46, respectively) can be made of a material that supports reflective surface (32, 34, 44, 46). Exemplary materials for the mirrors (20, 22, 40, 42) include a glass, ceramic, polymer, metal, alloy, composite, combinations thereof and the like. In a particular embodiment, mirrors (20, 22, 40, 42) independently include quartz, silicon, aluminum, and the like. Reflective surface (32, 34, 44, 46) can be a surface of mirrors (20, 22, 40, 42) or can be a coating disposed on the surface of the substrate material of mirror (20, 22, 40, 42). Exemplary reflective surfaces (32, 34, 44, 46) include a material to reflect laser beams (first laser beam 24, second laser beam 26, third laser beam 48, fourth laser beam 50, and their respective reflected laser beams 28, 30, 52, 54) or other radiation.

First laser beam 24, second laser beam 26, third laser beam 48, and fourth laser beam 50 independently can have the wavelength effective to interact with first ion beam 8 or intermediate ion beam 12 to cause a decrease in the first emittance of first ion beam 8. In an embodiment, the wavelength is from 200 nm to 3000 nm, specifically 250 nm to 2000 nm, and more specifically 300 nm to 1500 nm.

Article 2 has numerous uses. According to an embodiment, a process for cooling first ion beam 8 includes receiving first ion beam 8 that includes a first brightness in cooler 6, which includes first mirror 20 having first reflective surface 32 and second mirror 22 having second reflective surface 34 opposingly disposed to first reflective surface 32. The process also includes receiving first laser beam 24 in cooler 6, receiving second laser beam 26 in cooler 6, transmitting first laser beam 24 and second laser beam 26 through first ion beam 8, reflecting first laser beam 24 from first mirror 20, reflecting second laser beam 26 from second mirror 22, and transmitting (after being reflected) first laser beam 24 and second laser beam 26 through first ion beam 8 to cool first ion beam 8 and to decrease the emittance of first ion beam 8 to produce second ion beam 10. Here, second ion beam 10 includes a second brightness that is greater than the first brightness.

According to an embodiment, cooler 6 receives laser beams (24, 26, 48, 50) that are counter-propagating and transverse to first ion beam 8 or intermediate ion beam 12. The laser beams (24, 26, 48, 50) have a wavelength that is at or near a frequency of an optical transition of ions in first ion beam 8 or intermediate ion beam 12. In a certain embodiment, for full brightness enhancement, a plurality of pairs of laser beams (e.g., two pairs of laser beams such as a first pair of laser beams (24, 26) and a second pair of laser beams (48, 50)) are provided for each orthogonal direction transverse to first ion beam 8. It is contemplated that for cooling, laser beams (24, 26, 48, 50) independently are tuned a few line widths below a resonance. In some embodiments, laser beams (24, 26, 48, 50) are tuned within two natural line widths (+/−10%) of the optical transition, e.g., depending on ions in first ion beam 8, within from 0.1 MHz to 50 MHz of the optical transition. In some embodiments, another detuning is used, such as above resonance for a so-called "blue molasses." It is contemplated that a polarization of the counter-propagating laser beams is selected so that cooling proceeds as Doppler cooling, as polarization gradient cooling (which has a lower cooling limit but a smaller capture velocity), as Sisyphus cooling, and the like.

In an embodiment, a region of cooler 6 that is illuminated by laser beams (24, 26, 48, 50) extends along first ion beam 8 and intermediate ion beam 12 for the full interaction distance between the laser beams and ion beams (8, 12). This can be accomplished, in an embodiment, by using beam-forming cylindrical optics on the laser beams (24, 26, 48, 50). In some embodiments, two mirrors (e.g., 20, 22 or 40, 42) are opposingly disposed on either side of ion beams (8, 12) such that mirrors (20, 22 or 40, 42) tilt at a selected angle with respect to each other, and lasers beams (24, 26, 48, 50) are reflected multiple times along a length of ion beams (8, 12), e.g., as shown in FIG. 5. According to some embodiments, an array of laser beams is formed by a series of beam splitters and reflectors. For some ionic species, another laser frequency is used to counteract an optical leak that may be present in the ion's energy level scheme.

After traversing cooler 6, a transverse velocity distribution of intermediate ion beam 12 and second ion beam 10 is narrower than a transverse velocity distribution of first ion beam 8 before first ion beam 8 interacts with laser beams (24, 26, 48, 50), as shown in FIG. 2, wherein in FWHM2 is less than FWHM1 respectively for second ion beam 10 and first ion beam 8. In an embodiment, an interaction time between first ion beam 8 and intermediate ion beam 12 with laser beams (24, 26, 48, 50) is selected to be long enough so that the transverse velocity spread FWHM2 reflects a Doppler temperature of ions in second ion beam 10, or FWHM2 may approximate a recoil limit, e.g., when cooler 6 provides for polarization gradient cooling of first ion beam 8. Here, a Doppler-limited velocity spread is given by $(\hbar\Gamma/2\,m)^{1/2}$, and a recoil limit is given by $\hbar k/m$, where $\Gamma$ is the optical transition rate, m is the ion mass, and $k=2\pi/\lambda$ with $\lambda$ being the wavelength of laser beam (24, 26, 48, 50).

In an embodiment, second ion beam 10 has transverse velocity spread FWHM2 and also second brightness, which is enhanced over the first brightness of first ion beam 8 by a factor equal to a square of a ratio of first velocity spread FWHM1 (before cooling, which is substantially a capture velocity) to second velocity spread FWHM2 after cooling (which is a Doppler limit or lower). According to an embodiment, first ion beam 8 includes $Ba^+$ for which a capture velocity is approximately 40 m s$^{-1}$, and a Doppler limit is about 0.16 m s$^{-1}$. Here, the second brightness of second ion beam 10 is greater than a factor of at least $6\times10^4$ than the first brightness of first ion beam 8.

In a particular embodiment, the first brightness is, e.g., 200 A m$^{-2}$sr$^{-1}$eV$^{-1}$, and the second brightness is greater than or equal to $10^6$ A m$^{-2}$sr$^{-1}$eV$^{-1}$, and specifically greater than or equal to $10^7$ A m$^{-2}$sr$^{-1}$eV$^{-1}$, and more specifically greater than or equal to $10^8$ A m$^{-2}$sr$^{-1}$eV$^{-1}$.

According to an embodiment, the second brightness has a magnitude of brightness that beneficially counteracts, overcomes, or diminishes an effect of Coulomb interactions (e.g., electrostatic repulsion of charged particles) between ions in first ion beam 8 or between ions in second ion beam 10. Without attaining the magnitude of the second brightness, Coulomb interactions among ions could decrease a brightness of an ion beam. Without wishing to be bound by theory, transverse heating may result from Coulomb interactions, and transverse heating may become significant depending on more current density and ion beam energy. Brightness B of an ion beam is proportional to beam current density J, i.e., $B \propto J/(\Delta\Omega U)$, where J is the beam current density, $\Delta\Omega$ is a solid angle spread (also referred to as angular dispersion), and U is the beam energy. Although one might think that brightness B can be increased by increasing J and decreasing U, these changes increase Coulomb interactions and produce heating, which increases $\Delta\Omega$ and decreases B.

In an embodiment, article 2 cools first ion beam 8 to produce second ion beam 10 that is, with respect to its transverse velocity distribution, transversely cooler than first ion beam 8, based on a spread of the distribution, which can be characterized by FWHM2. Here, cooling decreases heat from first ion beam 8 produced by Coulomb interactions among the plurality of ions in first ion beam 8 such that the second brightness is increased from the first brightness of first ion beam 8. It is believed that the process for cooling first ion beam 8 to produce a large magnitude of the second brightness relative to the first brightness, in part, is an outcome of decreasing effects of Coulomb interactions to an amount that provides surprising applicability focused ion beam methods and apparatus.

According to some embodiments, article 2 is used to separate ions based on atomic mass number, to select ions of an atomic mass number, to select an isotope or nuclide of an ion, and the like that is accomplished by the cooling process herein. In an embodiment, cooling in cooler 6 cools, e.g., a single isotope of an ionic species in ion beam (8, 12) via a spectroscopic isotope shift of certain isotopes of an ion. In a particular embodiment, first ion beam 8 includes a single isotope and is collimated into a first portion to increase its brightness, and a second portion of first ion beam 8 does not have experience a change, i.e., an increase in its brightness. Thus, it is contemplated second ion beam 10 is produced by article 2 to be enriched in an isotope (relative to first ion beam 8) by transmitting second ion beam 12 through an aperture. In a certain embodiment, second ion beam 10 includes a single isotope and is produced by subjecting first ion beam 8 (having a plurality of nuclides or isotopes) to cooling of a single isotope. In a certain embodiment, second ion beam 10 (that includes a plurality of ions of which are a single isotope) is used with magnetic lenses to surprisingly produce a single focal spot ion beam (cf., such arrangement ordinarily would have different focal spots for each isotope) or implanting single-isotope ions for an isotope-dependent application.

In an embodiment, article 2 can be used to separate ions that have a different atomic mass number in first ion beam 8, wherein first ion beam 8 includes a composition that includes a plurality of first ions and a plurality of second ions, the first ions being different than the second ions, based on respective atomic numbers or atomic mass numbers of the first ions and the second ions. Here, a process for separating ions in first ion beam 8 includes providing first ion beam 8, receiving first ion beam 8 by cooler 6, subjecting first ion beam 8 to a plurality of laser beams, cooling first ion beam 8 by interacting the plurality of laser beams with the first ions or the second ions in first ion beam 8, separating the first ions from the second ions by selectively cooling the first ions or the second ions, producing second ion beam 10 that includes a plurality of ions selected from a group consisting of the first ions and the second ions to separate the plurality of ions in first ion beam 8, wherein first ion beam 8 has a first brightness that is less than a brightness of second ion beam 10.

Embodiments herein provide cooling first ion beam 8 to produce second ion beam 10 with second brightness. Such embodiments have beneficial advantages. In a particular embodiment, second ion beam 10 includes Ba$^+$ with second brightness greater than or equal to $10^7$ Å m$^{-2}$sr$^{-1}$eV$^{-1}$. It should be appreciated that Ba$^+$ (138 atomic mass units (amu)) can be considered to be a heavy element. Thus, the high brightness ion beam of Ba$^+$ (referred to here as the second ion beam) can be used, e.g., to remove material from a sample by second ion beam 10, i.e., second ion beam 10 can nanomill the sample. Additionally, second ion beam 12 can be used to polish or nanofabricate a structure.

Furthermore, article 2 can receive first ion beam 8 having a large range of axial velocities or transverse velocities. In one embodiment, first ion beam 8 is a low-energy ion beam having a kinetic energy from the 500 millielectronvolts (meV) to 5000 electron volts (eV), specifically from 1 eV to 2000 eV, and more specifically from 10 eV to 1000 eV. A transverse velocity spread FWHM1 of first ion beam 8 can be from 1 meters per second (m/s) to 1000 m/s, specifically from 1 m/s to 100 m/s, and more specifically from 1 m/s to 50 m/s. A transverse velocity spread FWHM2 of second ion beam 10 can be from $10^{-2}$ m/s to 100 m/s, specifically from $10^{-1}$ m/s to 50 m/s, and more specifically from 0.3 m/s to 10 m/s. First ion beam 8 can have a velocity with an axial velocity (directed along a length of cooler 6), transverse velocity, transverse velocity spread, temperature (axial velocity spread, i.e., translational temperature), spot size, current, kinetic energy, or first brightness. Further, second ion beam 10 can have a selected velocity with an axial velocity (collinear with a length of cooler 6), transverse velocity, transverse velocity spread, temperature (axial velocity spread, i.e., translational temperature), spot size, current, kinetic energy, or second brightness.

The first brightness can be can be from 10 to $10^6$ A m$^{-2}$ sr$^{-1}$ eV$^{-1}$, specifically from 50 to $10^5$ A m$^{-2}$ sr$^{-1}$ eV$^{-1}$, and more specifically from 100 to $10^4$ A m$^{-2}$ sr$^{-1}$ eV$^{-1}$. The second brightness can be from can be from $10^3$ to $10^8$ A m$^{-2}$ sr$^{-1}$ eV$^{-1}$, specifically from $10^4$ to $10^7$ A m$^{-2}$ sr$^{-1}$ eV$^{-1}$, and more specifically from $10^5$ to $10^6$ A m$^{-2}$ sr$^{-1}$ eV$^{-1}$.

A kinetic energy of first ion beam 8 and a length of an interaction distance in cooler 6 between the laser beams and first ion beam 8 or intermediate ion beam 12 are selected to fully cool the ions in first ion beam 8 by cooling. If the energy of the ions is U, the mass is m, and the interaction distance is L, full cooling (e.g., cooling the ions to within their Doppler limit) occurs for L (m/2U)$^{1/2}$≥$t_c$, where $t_c$ is the laser cooling time. In an embodiment, for Ba$^+$, $t_c$≈50 µs so that for L=0.3 m, U can be 10 eV, which is a kinetic energy corresponding to an ion velocity of approximately 3700 m s$^{-1}$.

In an embodiment, a degree of collimation of first ion beam 8 is selected so that a majority of the transverse velocities of the ions in first ion beam 8 is within a capture range for cooling by the laser beams. In an embodiment, first ion beam 8 includes 10 eV Ba$^+$ ions with a capture velocity of 40 m s$^{-1}$ such that a collimation angle less than or equal to 1 millirad (mrad).

According to an embodiment, a system includes ion source 4 and cooler 6 to produce second ion beam 10 that can advantageously be used in nanoscale focused ion beam applications. Given the high brightness of the second brightness of second ion beam 10, second ion beam 10 can have more current contained in a smaller spot as compared with first ion beam 8. Applications of the system or article 2 include ion microscopy, nanoscale milling or machining, secondary ion mass spectrometry, and the like.

The articles and processes herein are illustrated further by the following Examples, which are non-limiting.

EXAMPLE

Example

Cooling a Ba$^+$ Ion Beam

Figure 9:
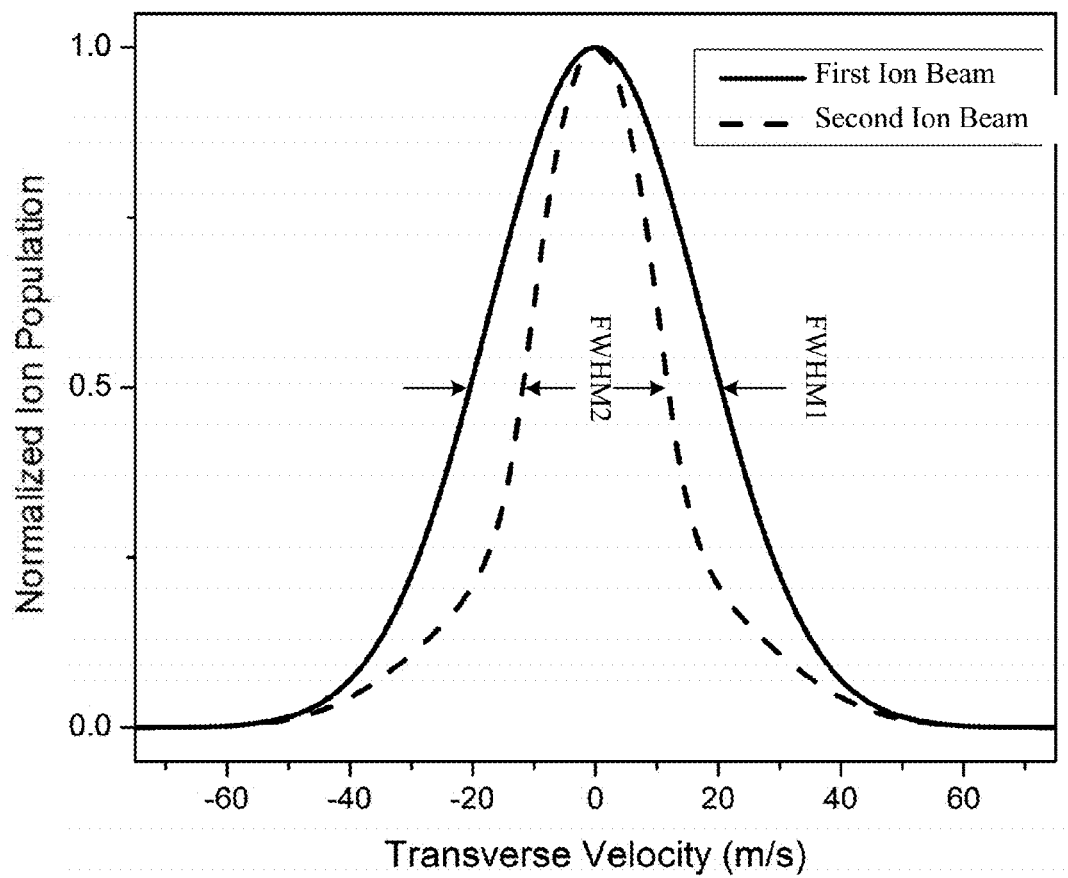
FIG. 9 shows a graph of normalized ion population versus transverse velocity according to the Example.

A first ion beam that includes Ba$^+$ has an energy U=5 eV and a transverse velocity spread (FWHM1) of approximately 40 m/s. A transverse velocity spread is selected to create the first ion beam. The first ion beam is transmitted to a cooler having length L=0.5 m in which the first ion beam has an approximately 130 µs interaction time with laser beams in the cooler. Lasers that cools the Ba+ in the first ion beam have a wavelength of 493 nm is resonant with a cooling transition of Ba+ and a wavelength of 650 nm for optical repumping transition with intensities equal to 10 times the saturation intensity and detunings 30 MHz to the red of their respective transitions to cool first ion beam 8 and intermediate ion beam produced therefrom to produce second ion beam. The second ion beam has a traverse velocity spread (FWHM2) of approximately 22 m/s. FIG. 9 shows a graph of normalized ion population versus transverse velocity. Transverse velocity spread FWHM2 of the second ion beam is less than transverse velocity spread FWMH1 of the first ion beam. The decrease in velocity spread from FWHM1 to FWHM1 results in a decrease in emittance of the second ion beam relative to the emittance of the first ion beam. Since the total ion currents of the first ion beam and second ion beam are equal, the decreased emittance results in a brightness of the second ion beam that is greater than the brightness of the first ion beam.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A focused ion beam article comprising:
   an ion source configured to provide a first ion beam comprising a first brightness;
   a transverse laser cooler configured to receive the first ion beam and to produce a second ion beam from the first ion beam, the second ion beam comprising a second brightness that is greater than the first brightness; and
   an objective lens to receive the second ion beam, to focus the second ion beam, and to transmit the second ion beam with a higher ion current in a smaller spot size as compared with the first ion beam,
   wherein the transverse laser cooler and the objective lens in combination reduce transverse chromatic aberrations of the second ion beam.

2. The focused ion beam article of claim 1, wherein the transverse laser cooler comprises a Doppler cooler.

3. The focused ion beam article of claim 1, wherein the transverse laser cooler comprises a polarization gradient cooler, a Sisyphus cooler, or a combination comprising at least one of the foregoing transverse laser coolers.

4. The focused ion beam article of claim 1, wherein the transverse laser cooler comprises:
   a Doppler cooler to receive the first ion beam and to produce an intermediate ion beam comprising an intermediate brightness that is greater than the first brightness; and a polarization gradient cooler to receive the intermediate ion beam and
   to produce the second ion beam from the intermediate ion beam, the second brightness being greater than the intermediate brightness.

5. The focused ion beam article of claim 1, wherein the ion source comprises a surface ionization ionizer, an ion extractor, an electron impact ionizer, a field ionizer, a photo ionizer, or combination comprising at least one of the foregoing ion sources.

6. The focused ion beam article of claim 1, wherein the transverse laser cooler is configured to:
   receive a first laser beam; and
   transmit the first laser beam through the first ion beam, and
   the transverse laser cooler comprises a first mirror configured to receive the first laser beam and to reflect the first laser beam through the first ion beam to decrease the emittance of the first ion beam.

7. The focused ion beam article of claim 6, wherein the first mirror comprises a first planar reflective surface to reflect the first laser beam, the first planar reflective surface being parallel to a centerline of the first ion beam.

8. The focused ion beam article of claim 6, wherein the transverse laser cooler is further configured to:
   receive a second laser beam; and
   transmit the second laser beam through the first ion beam, and the transverse laser cooler further comprises a second mirror configured to receive the second laser beam and to reflect the second laser beam through the first ion beam to decrease the emittance of the first ion beam.

9. The focused ion beam article of claim 8, wherein first mirror comprises a first reflective surface to reflect the first laser beam; the second mirror comprises a second reflective surface to reflect the second laser beam such that the first reflective surface is opposingly disposed to the second reflective surface; and a centerline of the first ion beam is substantially equidistant from the first reflective surface and the second reflective surface.

10. The focused ion beam article of claim 8, wherein the transverse laser cooler further comprises:
a first pair of mirrors comprising:
the first mirror; and
the second mirror; and
a second pair of mirrors disposed orthogonal to the first pair of mirrors and comprising:
a third mirror; and
a fourth mirror.

11. The focused ion beam article of claim 10, wherein the transverse laser cooler is configured to:
receive a third laser beam;
transmit the third laser beam through the first ion beam;
receive a fourth laser beam; and transmit the fourth laser beam through the first ion beam to decrease the emittance of the first ion beam.

12. The focused ion beam article of claim 11, wherein the third mirror is configured to:
receive the third laser beam,
reflect the third laser beam through the first ion beam, and decrease the emittance of the first ion beam; and
the fourth mirror is configured to:
receive the fourth laser beam,
reflect the fourth laser beam through the first ion beam, and
decrease the emittance of the first ion beam.

13. The focused ion beam article of claim 12, wherein third mirror comprises a third reflective surface to reflect the third laser beam; the fourth mirror comprises a fourth reflective surface to reflect the fourth laser beam such that the third reflective surface is opposingly disposed to the fourth reflective surface; and the centerline of the first ion beam is substantially equidistant from the first reflective surface, the second reflective surface, the third reflective surface, and the fourth reflective surface.

14. The focused ion beam article of claim 9, wherein the first reflective surface and the second reflective surface respectively comprise a planar reflective surface or a curved reflective surface.

15. The focused ion beam article of claim 14, wherein the first reflective surface and the second reflective surface each comprise the curved reflective surface, and the curved reflective surface comprises a convex reflective surface facing the centerline of the first ion beam.

16. The focused ion beam article of claim 13, wherein the first reflective surface, the second reflective surface, the third reflective surface, and the fourth reflective surface respectively comprise a planar reflective surface or a curved reflective surface.

17. The focused ion beam article of claim 16, wherein the first reflective surface, the second reflective surface, the third reflective surface, and the fourth reflective surface each comprise the curved reflective surface, and the curved reflective surface comprises a convex reflective surface facing the centerline of the first ion beam.

18. The focused ion beam article of claim 1, wherein the first ion beam and the second ion beam are collinear.

19. The focused ion beam article of claim 1, wherein the first ion beam and second ion beam independently comprise a plurality of ions that comprises a monovalent cation of an element from period 5, period 6, period 7, period 8, or a combination comprising at least one of the foregoing;
an energy of the first ion beam is from the 500 millielectronvolts (meV) to 2000 electron volts (eV); and the second brightness is greater than $1 \times 10^6$ amps per square meter per steradian per electron volt ($A\,m^{-2}\,sr^{-1}\,eV^{-1}$).

20. A process for transverse laser cooling, the process comprising:
receiving a first ion beam comprising a first brightness in a transverse laser cooler, the transverse laser cooler comprising:
a first mirror comprising a first reflective surface; and
a second mirror comprising a second reflective surface, the second reflective surface being disposed opposingly to the first reflective surface;
receiving a first laser beam in the transverse laser cooler;
receiving a second laser beam in the transverse laser cooler;
transmitting the first laser beam and the second laser beam through the first ion beam;
reflecting the first laser beam from the first mirror;
reflecting the second laser beam from the second mirror;
transmitting, after being reflected, the first laser beam and the second laser beam through the first ion beam to transversely cool the first ion beam and to decrease the emittance of the first ion beam to produce a second ion beam comprising a second brightness that is greater than the first brightness;
transmitting the second ion beam to an objective lens;
receiving, by the objective lens, the second ion beam;
focusing, by the objective lens, the second ion beam; and
transmitting, from the objective lens, the second ion beam with a higher ion current in a smaller spot size as compared with the first ion beam, wherein the transverse laser cooler and the objective lens in combination reduce transverse chromatic aberrations of the second ion beam.

* * * * *